(12) United States Patent
Takaishi (10) Patent No.: US 7,112,843 B2
(45) Date of Patent: Sep. 26, 2006

(54) SEMICONDUCTOR DEVICE WITH LOW RESISTANCE REGION

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 73 days.

(21) Appl. No.: 10/809,682

(22) Filed: Mar. 26, 2004

(65) Prior Publication Data
US 2004/0191996 A1    Sep. 30, 2004

(30) Foreign Application Priority Data
Mar. 31, 2003    (JP) .............................. 2003-095384

(51) Int. Cl.
*H01L 29/78* (2006.01)
(52) U.S. Cl. .............................. 257/330; 257/E29.201; 438/270
(58) Field of Classification Search ................ 257/330; 438/270
See application file for complete search history.

(56) References Cited
U.S. PATENT DOCUMENTS
4,767,722 A    8/1988    Blanchard
5,034,785 A    7/1991    Blanchard
6,008,520 A  * 12/1999    Darwish et al. ............ 257/330
6,144,067 A  * 11/2000    Kinzer ........................ 257/335

* cited by examiner

*Primary Examiner*—Asok Kumar Sarkar
(74) *Attorney, Agent, or Firm*—Rabin & Berdo, PC (57) ABSTRACT

A method for manufacturing a semiconductor device including the steps of: forming a hole having a predetermined depth in a semiconductor layer of a first conductivity type in correspondence with a drain region, the semiconductor layer being formed on a semiconductor substrate; forming a diffusion source layer containing impurities of a second conductivity type different from the first conductivity type in the hole; forming a source region of the first conductivity type in a region shallower than the depth of the hole in the semiconductor layer; forming a channel region of the second conductivity type to be disposed between the drain region and the source region in a region deeper than the depth of the source region in the semiconductor layer; and heating the semiconductor substrate to a first temperature after completing the diffusion source layer forming step to diffuse the impurities of the second conductivity type from the diffusion source layer into the channel region, thereby forming a low resistance region having a conductivity higher than that of the channel region.

9 Claims, 4 Drawing Sheets

SEMICONDUCTOR DEVICE WITH LOW RESISTANCE REGION

BACKGROUND OF THE INVENTION

1. Field of the Invention

The present invention relates to a semiconductor device such as a MOS FET and a method for manufacturing the semiconductor device, and especially to a super-minute semiconductor device and a method for manufacturing the semiconductor device.

2. Description of Related Art

Relating to MOS FET, a number of cells each including a drain region, a channel region and a source region are formed on a semiconductor substrate sometimes to constitute a discrete part. Recently, in a MOS FET, a drain region, a channel region and a source region are arranged in the vertical direction, that is, in the direction perpendicular to a semiconductor substrate so as to make minute the cell (see, for example, U.S. Pat. Nos. 4,767,722 and 5,034,785). By arranging such minute cells close to one another, the channel forming region (region through which drain current flows) can be enlarged, so that ON-resistance can be reduced.

On the other hand, in a circuit including a MOS FET, when the MOS FET is turned from ON-state to Off-state, a back electromotive force from the inductance component of the circuit is applied to the MOS FET and current flows through a channel region. Thereby, the channel region generates heat and sometimes the device is broken (avalanche breakage). This is because, in a parasitic transistor including a drain region as a collector, a channel region as a base and a source region as an emitter, due to the base resistance of the channel region being high, the parasitic transistor is easily turned to ON-state and high current flows through the channel region.

In order to prevent this, between a source deriving electrode connected to a source region and a channel region in a MOS FET, provided is a region having conductivity higher than that of the channel region (low resistance region) so as to reduce the base resistance. In this case, if a back electromotive force is applied to the MOS FET, the parasitic transistor is not easily turned to ON-state, so that the device can be protected from avalanche breakage.

Such a low resistance region has been formed by using a mask having openings of predetermined pattern and ion-implanting impurities into regions between adjacent cells of the semiconductor substrate through the openings of the mask.

However, for obtaining a further minute (super-minute) semiconductor device, the space between cells becomes smaller and therefore the regions into which impurities are ion-implanted also become smaller. As a result, the openings through which impurities are ion-implanted are required to be minute. However, by ion-implanting through such minute openings, impurities cannot diffuse deep into the semiconductor substrate, so that a low resistance region capable of sufficiently reducing the base resistance cannot be formed.

For example, by conventional methods, a MOS FET provided with a low resistance region capable of sufficiently reducing the base resistance and having cell size of 1.35 µm cannot be manufactured. That is, a MOS FET having low ON-resistance and high tolerance against breakage due to a back electromotive force cannot be manufactured.

SUMMARY OF THE INVENTION

An object of the present invention is to provide a method for manufacturing a semiconductor device having a low ON-resistance and high tolerance against breakage due to a back electromotive force.

Another object of the present invention is to provide a semiconductor device having a low ON-resistance and high tolerance against breakage due to a back electromotive force.

A method for manufacturing a semiconductor device according to a first aspect of the present invention includes the steps of: forming a hole having a predetermined depth in a semiconductor layer of a first conductivity type, the semiconductor layer being formed on a semiconductor substrate as constituting a part of drain region; forming a diffusion source layer in the hole, the diffusion source layer containing impurities of a second conductivity type different from the first conductivity type; forming a source region of the first conductivity type in a region shallower than the depth of the hole in the semiconductor layer; forming a channel region of the second conductivity type in a region deeper than the depth of the source region in the semiconductor layer so as to be disposed between the drain region and the source region; and heating the semiconductor substrate to a first temperature after completing the diffusion source layer forming step to diffuse the impurities of the second conductivity type from the diffusion source layer into the channel region, thereby forming a low resistance region having a conductivity higher than that of the channel region.

According to the present invention, a semiconductor device can be manufactured in which the drain region, the channel region and the source region are arranged in the vertical direction, that is, in the direction perpendicular to the semiconductor substrate. Such a semiconductor device can be made super-minute (for example, having a cell size of 1.35 µm), so that the channel forming region (region through which drain current flows) can be enlarged. As a result, according to the present invention, a semiconductor device having a low ON-resistance can be obtained.

Further, according to the present invention, by the step of heating the semiconductor substrate to the first temperature (the first heating step), impurities of the second conductivity type diffuse from the diffusion source layer formed in a region including the inside of the hole into the channel region to form a low resistance region. Therefore, the low resistance region partly constituting the inner wall of the hole and being in contact with the channel region can be obtained.

Since the conductivity types of the drain region, the channel region and the low resistance region, and the source region are the first conductivity type, the second conductivity type and the first conductivity type respectively, they constitute a parasitic transistor. When a back electromotive force is applied to a circuit including this semiconductor device, the drain region becomes a collector and the channel region and the low resistance region become a base, with the source region becoming an emitter.

In this parasitic transistor, since the conductivity of the low resistance region is higher than that of the channel region, the base resistance is reduced. Therefore, the parasitic transistor is not easily turned to ON-state if a back electromotive force is applied between the source region (source deriving electrode) and the drain region and high current is hard to flow through the channel region, so that the semiconductor device can be prevented from avalanche breakage. That is, a semiconductor device obtained by this manufacturing method according to the present invention has high tolerance against breakage due to a back electromotive force.

The low resistance region is formed not by ion-implanting impurities into the semiconductor substrate but by heat-diffusing impurities of the second conductivity type from the diffusion source layer formed in a region including the inside of the hole into the channel region. By using, for example, CVD (Chemical Vapor Deposition) method, the diffusion source layer can be formed even in a hole having a small width or diameter. Therefore, in the case of a super-minute cell, a low resistance region capable of a sufficiently reducing base resistance can be formed according to this manufacturing method. That is, a semiconductor device having a low ON-resistance and high tolerance against breakage due to a back electromotive force can be manufactured.

The semiconductor substrate may be a silicon substrate and may be provided with an epitaxial layer on the surface thereof. The hole may be a hole-shaped or groove (trench)-shaped one. When the second conductivity type is P-type, the impurities of the second conductivity type can be, for example, boron (B).

The first heating step can be carried out either with the diffusion source layer being formed in a larger region including the inside of the hole or with the diffusion source layer existing only inside the hole (for example, at a bottom of the hole).

For example, the abovementioned step of forming the diffusion source layer may include a step of forming the diffusion source layer at the bottom of the hole. In this case, if the diffusion source layer is formed in a region at the bottom of the hole and out of contact with the source region and the first heating step is carried out in this state, impurities of the second conductivity type in the diffusion source layer are hard to diffuse into the region for forming the source region of the first conductivity type. Therefore, the source region of the first conductivity type can be easily formed.

A first heating temperature used in the first heating step can be, for example, 900° C.~1000° C. By such heating, impurities of the second conductivity type can well diffuse from the diffusion source layer into the channel region.

The step of forming the diffusion source layer (the diffusion source layer forming step) may include a step of forming a polysilicon film doped with impurities of the second conductivity type in the hole.

The polysilicon film doped with impurities of the second conductivity type at a suitable concentration well serves as the diffusion source layer.

Such a polysilicon film can be formed by the steps of forming a polysilicon film undoped with impurities and then implanting impurities of the second conductivity type into the polysilicon film. The steps of forming the polysilicon film and implanting the impurities into the polysilicon film are usually performed in the process of manufacturing a semiconductor device. Therefore, such a method for manufacturing a semiconductor device as abovementioned can be easily carried out with the use of ordinary equipments for manufacturing a semiconductor device.

The abovementioned method for manufacturing a semiconductor device may further comprise a step of forming a source deriving electrode connected to the source region. In this case, the step of forming a source deriving electrode may include the steps of: forming an aluminum thin film on the surface of the semiconductor substrate with the polysilicon film existing in the hole after the step of heating the semiconductor substrate to the first temperature; and heating the semiconductor substrate provided with the aluminum thin film thereon to a second temperature allowing silicon to diffuse into aluminum.

With this arrangement, the step of heating the semiconductor substrate to the second temperature (the second heating step) allows silicon atoms in the polysilicon film (diffusion source layer) existing in the hole to diffuse into the aluminum thin film (source deriving electrode). Further, aluminum atoms in the aluminum thin film diffuse into the polysilicon film existing in the hole. Thereby, the aluminum thin film moves into the hole, and the hole is filled with the aluminum thin film (source deriving electrode).

Therefore, the source deriving electrode and the source region are suitably electrically connected to each other in the hole. As a result, the source region and the source deriving electrode are in contact with each other both inside and outside the hole (contact hole), so that a super-minute cell can be realized without decreasing the contact area between the source region and the source deriving electrode.

As silicon atoms diffuse from the polysilicon film (diffusion source layer) into the source deriving electrode, the source deriving electrode contains silicon.

The second heating step may be carried out either at the same time with or after completing the aluminum thin film forming step. Further, it is possible that the second heating step is carried out at the same time with the aluminum thin film forming step, and the second heating step is continued for a predetermined time after completing the aluminum thin film forming step.

The second temperature used in the second heating step is, for example, 380° C.~570° C. By heating the semiconductor substrate to a temperature above the 380° C., as mentioned above, aluminum atoms and silicon atoms well diffuse, thereby affording to suitably embed the source deriving electrode into the hole. Further, by heating the semiconductor substrate at a temperature below 570° C., aluminum atoms diffusing from the source deriving electrode embedded in the hole into the semiconductor substrate and the like can be reduced in amount.

This method for manufacturing a semiconductor device may further include a step of forming a scattering control layer on the diffusion source layer so as to control impurities of the second conductivity type contained in the diffusion source layer from scattering into the surrounding atmosphere in the first heating step, after the diffusion source layer forming step and before the first heating step.

With this arrangement, impurities of the second conductivity type contained in the diffusion source layer can be efficiently supplied to the channel region to form a low resistance region.

A semiconductor device according to a second aspect of the present invention includes: a plurality of cells each including a drain region of a first conductivity type; a channel region of a second conductivity type different from the first conductivity type and a source region of the first conductivity type stacked in this order on a semiconductor substrate so as to be capable of forming a channel in a direction of a thickness of the semiconductor device; and a low resistance region of the second conductivity type having a conductivity higher than that of the channel region, the low resistance region forming a part of an inner wall of a hole formed between adjacent ones of the plurality of cells, the low resistance region extending in an isotropic manner with respect to a predetermined region in the hole so as to be in contact with the channel region. The drain region is shared by the plurality of cells.

This semiconductor device can be manufactured by the method for manufacturing a semiconductor device according to the first aspect of the present invention.

This semiconductor device may further include a source deriving electrode being in contact with the source region and shared by the plurality of cells. In this case, the source deriving electrode may extend outside and inside the hole.

A semiconductor device according to a third aspect of the present invention includes: a plurality of cells each including a drain region of a first conductivity type; a channel region of a second conductivity type different from the first conductivity type and a source region of the first conductivity type stacked in this order on a semiconductor substrate so as to be capable of forming a channel in a direction of a thickness of the semiconductor substrate; and a low resistance region of the second conductivity type having a conductivity higher than that of the channel region, the low resistance region forming a part of an inner wall of a hole formed between adjacent ones of the plurality of cells and being formed in contact with the channel region. The drain region is shared by the plurality of the cells, and the size (e.g., width or spacing) of each of the cells is less than 2 μm.

A semiconductor device having such a small cell size can be manufactured by the abovementioned method for manufacturing a semiconductor device.

This semiconductor device may further include a source deriving electrode being in contact with the source region and shared by the plurality of cells. In this case, the source deriving electrode may extend outside and inside the hole.

In the abovementioned manufacturing method, by completing the second heating step before the polysilicon film (diffusion source layer) doped with impurities of the second conductivity type runs out, a semiconductor device having polysilicon in the hole can be obtained. Further, by continuing the second heating step till the diffusion source layer runs out, a semiconductor device having no polysilicon in the hole can be obtained.

The cell size (e.g., width or spacing) of this semiconductor device can be as small as, for example, 1.35 μm.

The low resistance region and the source region may be in contact with each other. Further, the low resistance region and the drain region may be in contact with each other.

With the abovementioned structure, since the low resistance region can exist extending throughout a large region between the source deriving electrode and the channel region, the base resistance of the parasitic transistor can be more reduced. As a result, the parasitic transistor can be effectively prevented from being turned to ON-state when a back electromotive force is applied thereto.

A semiconductor device having such a structure can be realized by controlling the depth of the contact hole, the disposition of the diffusion source layer, the first heating temperature and the heating time in the first heating step and the like in the abovementioned method for manufacturing a semiconductor device.

The low resistance region and the source deriving electrode may be in contact with each other.

With such a structure, the resistance between the channel region and the source deriving electrode becomes low, so that the base resistance of the parasitic transistor is reduced and the parasitic transistor can be effectively prevented from being easily turned to ON-state.

A semiconductor device having such a structure can be realized by controlling the second temperature and the heating time in the second heating step and the like in the abovementioned method for manufacturing a semiconductor device so that aluminum atoms constituting the aluminum thin film can diffuse to reach the depth in the hole corresponding to the depth at which the low resistance region is formed.

The abovementioned and further objects, features and effects of the present invention will become more apparent from the following description of the embodiments given with reference to the appended drawings.

DESCRIPTION OF THE PREFERRED EMBODIMENTS

Figure 1:
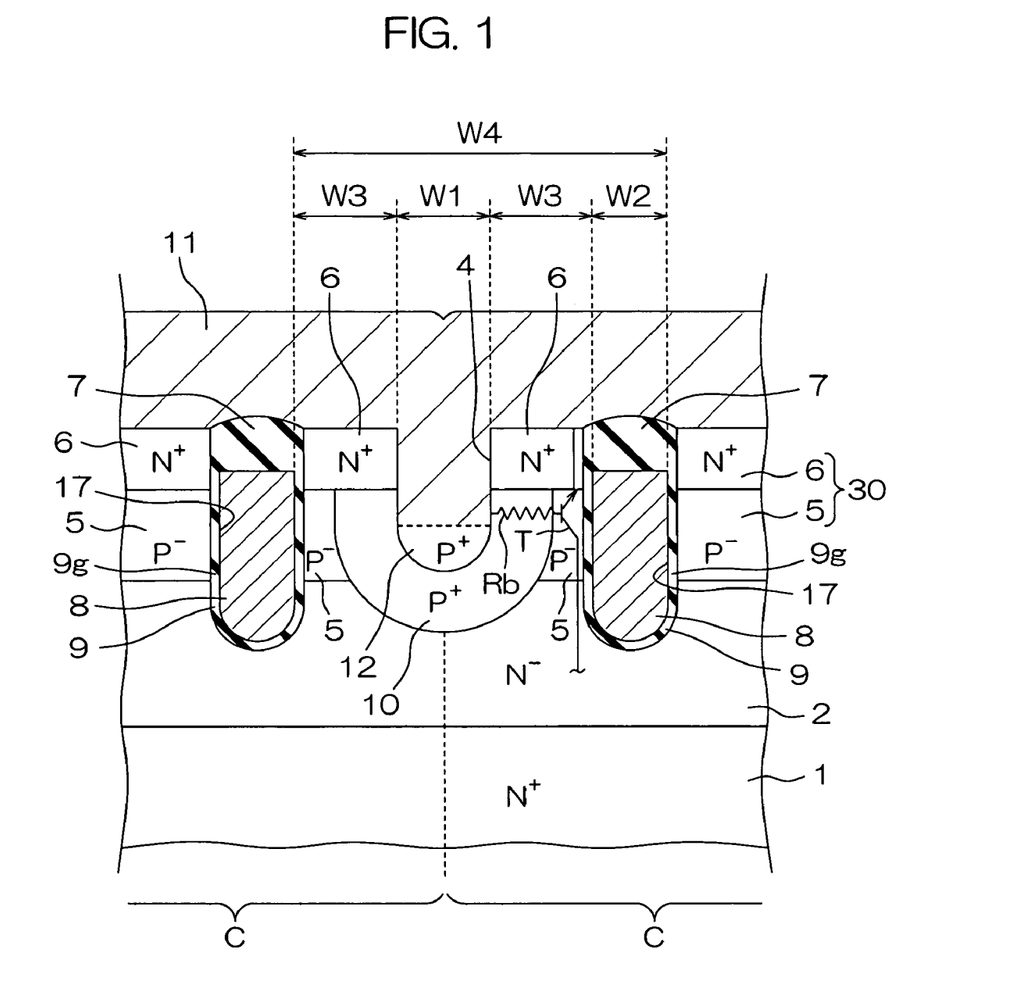
FIG. 1 is a schematic sectional view for explaining structure of a MOS FET according to an embodiment of the present invention.

FIG. 1 is a schematic sectional view showing a structure of a MOS FET (Metal Oxide Semiconductor Field Effect Transistor) manufactured by the method according to the present invention.

An $N^-$-type epitaxial layer 2 is formed on the surface of an $N^+$-type silicon (Si) substrate 1. A diffusion region 30 in which impurities are diffused is formed on the epitaxial layer 2. The diffusion region 30 includes a $P^-$-type channel region 5 disposed in the lower part (on the epitaxial layer 2 side) and an $N^+$-type source region 6 disposed on the channel region 5.

In the sectional view of FIG. 1, a plurality of trenches (grooves) 17 penetrating the diffusion region 30 and reaching midway of the thickness of the epitaxial layer 2 are formed so as to be substantially parallel with each other. Each of the trenches 17 extends in the direction along the surface of the silicon substrate 1 (the direction perpendicular to the paper surface in FIG. 1). Within each of the trenches 17, a gate electrode 8 formed of polysilicon made conductive by adding impurities is disposed. Therefore, the gate electrodes 8, as well as the trenches 17, extends in the direction along the surface of the silicon substrate 1. The trenches 17 and the gate electrodes 8 may be formed in a grid-like arrangement along the surface of the silicon substrate 1.

An oxide film 9 is formed along the inner wall of each trench 17. The portion of the oxide film 9 between the channel region 5 and the gate electrode 8 serves as a gate oxide film 9g. A silicon oxide layer 7 is formed on the gate electrode 8. The gate electrode 8 is electrically insulated from the epitaxial layer 2, the channel region 5 and the source region 6 by means of the oxide film 9 and silicon oxide layer 7. The gate electrode 8 is externally connected at the end portion of the silicon substrate 1 outside this Figure.

Between the adjacent gate electrodes 8, a contact hole 4 is formed. The contact hole 4 penetrates the source region 6 and has a depth not reaching the epitaxial layer 2. That is, the depth of the contact hole 4 is smaller than that of the trench 17. A $P^+$-type diffusion source layer 12 mainly of polysilicon is provided in the bottom portion of the contact hole 4 at the position deeper than the source region 6. Impurities such as boron (B) for $P^+$-type control have been introduced at a high concentration into the diffusion source layer 12.

In the region extending in an isotropic manner from the diffusion source layer 12, a $P^+$-type low resistance region 10 is formed. The low resistance region 10 forms a part of the inner wall of the contact hole 4. The same kind of $P^+$-type impurities such as boron as those introduced into the diffusion source layer 12 have been introduced into the low resistance region 10 so that the low resistance region 10 has a conductivity higher than that of the channel region 5 (has a resistance lower than that of the latter). The low resistance region 10 is in contact with the channel region 5, the source region 6 and the epitaxial layer 2 but not in contact with the oxide film 9 and the silicon oxide layer 7.

On the diffusion region 30 and the silicon oxide layer 7, a source deriving (or, driving) electrode 11 mainly of aluminum (Al) is formed so as to fill the contact hole 4. The source deriving electrode 11 and the gate electrode 8 are electrically insulated from each other by means of the silicon oxide layer 7.

The source deriving electrode 11 contains a little amount of (for example, lower than 1% by atom ratio of the aluminum amount) silicon. Both inside and outside the contact hole 4, the source deriving electrode 11 is in contact with the source region 6. Further, the source deriving electrode 11 is in contact with the low resistance region 10 in side the contact hole 4.

An unshown electrode is connected to the silicon substrate 1 (drain). By applying a predetermined voltage between this electrode and the source deriving electrode 11 and at the same time controlling the potential of the gate electrode 8 to a predetermined value, a channel is formed in a region of the channel region 5 near the gate oxide film 9g, so that current (drain current) can flow between the source region 6 and the epitaxial layer 2. The drain current flows near and along the gate oxide film 9 in the channel region 5.

In a MOS FET having the abovementiond structure, a large number of cells C each including the epitaxial layer 2 (drain region), the channel region 5 and the source region 6 are formed close to one another (that is, densely).

The width W1 of the contact hole 4 is, for example, 0.35 µm. The width W2 of the gate electrode 8 is, for example, 0.5 µm, and the space W3 between the contact hole 4 and the gate electrode 8 is, for example, 0.25 µm. Consequently, the width W4 of a cell C (the interval between adjacent two contact holes 4; the cell size) of this MOS FET is, for example, 1.35 µm.

Since the epitaxial layer 2 (drain region), the channel region 5 and the source region 6 are formed in the vertical direction (direction perpendicular to the silicon substrate 1), such a super-minute cell C has been realized. Further, since the source region 6 and the source deriving electrode 11 are in contact with each other both inside and outside the contact hole 4, such a super-minute cell C has been realized without decreasing the contact area between the source region 6 and the source deriving electrode 11.

By making minute each cell C and at the same time disposing cells C close to one another as abovementioned, a large number of cells C can be formed per unit area. As a result, the channel forming regions and the regions in the epitaxial layer 2 through which current flows per unit area can be increased. Therefore, ON-resistance can be reduced.

On the other hand, in a parasitic transistor T in which the epitaxial layer 2 is a collector and the channel region 5 and the low resistance region 10 are a base with the source region 6 being an emitter, the base resistance Rb is reduced because the low resistance region 10 exists which has a conductivity higher than that of the channel region 5. Since the low resistance region 10 is so formed as to be in contact with the source region 6 and the epitaxial layer 2, the low resistance region 10 exists throughout a large region between the source deriving electrode 11 and the channel region 5. Further, since the low resistance region 10 is so formed as to be in contact with the channel region 5 and the source deriving electrode 11, the resistance between the channel region 5 and the source deriving electrode 11 is reduced. From these reasons too, the base resistance Rb is reduced.

When this MOS FET is turned from ON-state to OFF-state in a circuit including this MOS FET, a back electromotive force is given to this MOS FET by the inductance component of the circuit. However, since the base resistance Rb is low, this parasitic transistor T is not easily turned to ON-state. Therefore, high current is hard to flow through the channel region 5, so that avalanche breakage is hard to occur. That is, such a MOS FET has high tolerance against breakage due to a back electromotive force.

Now, a method for manufacturing such a MOS FET will be described in the following. FIGS. 2(a)~2(g) are schematic sectional views showing a method for manufacturing the MOS FET shown in FIG. 1.

Figure 2A:
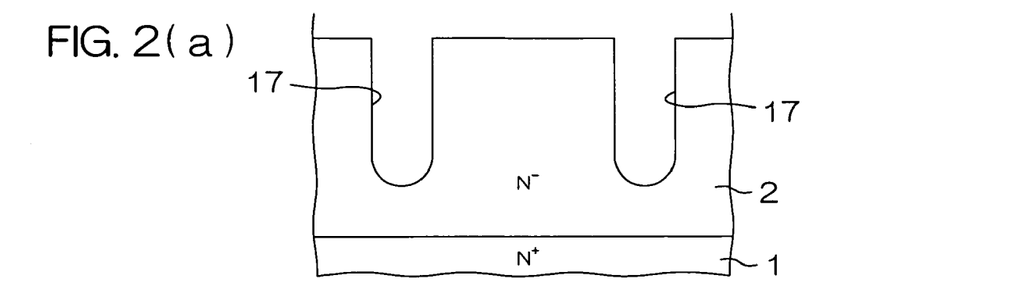
FIGS. 2(a)~2(g) are schematic sectional views for explaining a method for manufacturing the MOS FET of FIG. 1.

First, an. N⁻-type epitaxial layer 2 is formed on the surface of a silicon (Si) substrate 1 and trenches 17 are formed in the epitaxial layer 2 by reactive ion etching with the use of a mask having openings of a predetermined pattern. This state is shown in FIG. 2(a).

Next, sacrificial oxide film is formed on the exposed surface of the epitaxial layer 2 including the inner wall of the trenches 17, and thereafter the sacrificial oxide film is made thinner by etching. The remainder of the sacrificial oxide film becomes an oxide film 19. The part of the oxide film 19 inside the trench 17 becomes an oxide film 9. The oxide film 19 also extends on the surface of the epitaxial layer 2 outside the trenches 17.

Figure 2B:
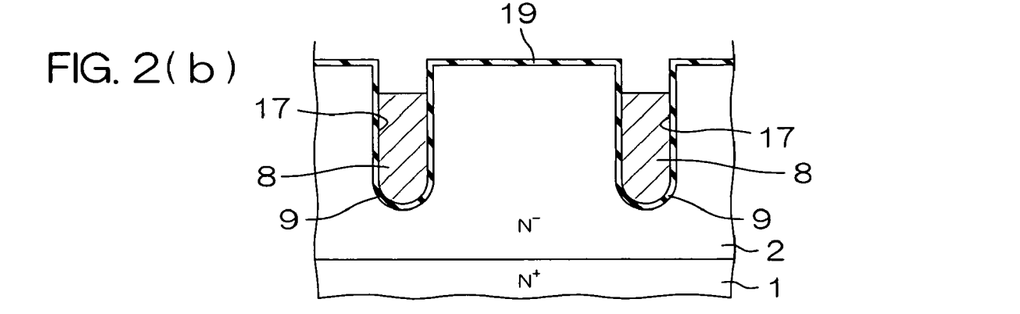

Then, a polysilicon film made conductive by introducing impurities is formed on the whole surface of the epitaxial layer 2. Such a polysilicon film may be formed by the steps of forming a polysilicon film undoped with impurities and then implanting impurities into the polysilicon film.

Then, by etching back, the parts of the polysilicon film outside each trench 17 and in the shallow region inside each trench 17 (region deeper than the depth of the source region 6 and shallower than the bottom of the trench 17) are removed. The remainder of the polysilicon film becomes a gate electrode 8. This state is shown in FIG. 2(b).

After these steps, silicon oxide is deposited on the epitaxial layer 2 to form a silicon oxide film. The silicon oxide film is formed also on the gate electrode 8 in each trench 17. Then, the silicon oxide film is substantially removed except the portions in the trenches 17 by etching back. The remainder of the silicon oxide film becomes a silicon oxide layer 7. At this time, the oxide film 19 is also left.

In this step, the silicon oxide may be formed by firstly forming a film of TEOS (tetraethylorthosilicate) and then turning the TEOS film to a silicon oxide film through thermal decomposition or the like, instead of depositing silicon oxide directly on the epitaxial layer 2. Further, a nitride film may be formed instead of the silicon oxide film. In this case, a silicon nitride layer having a shape similar to that of the silicon oxide layer 7 is obtained instead of the silicon oxide layer 7.

Figure 2C:
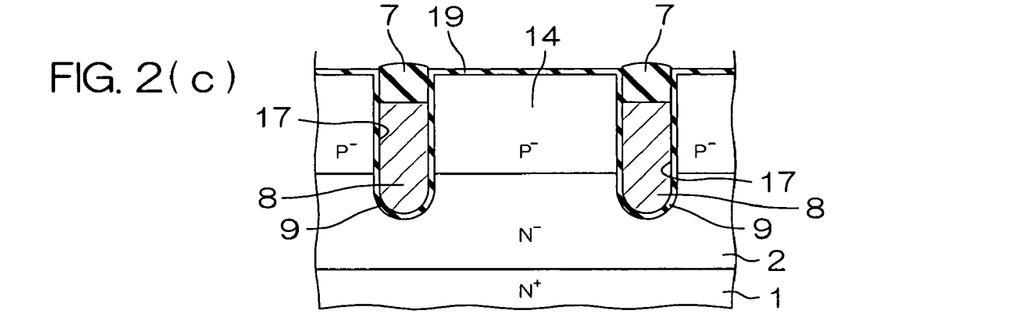

Then, P-type impurities are implanted to the surface portion of the epitaxial layer 2 through the oxide film 19, so that a P⁻-type channel region 14 is formed. This state is shown in FIG. 2(c). The word "epitaxial layer 2" hereinafter referred to mean only the N⁻-type portion.

Figure 2D:
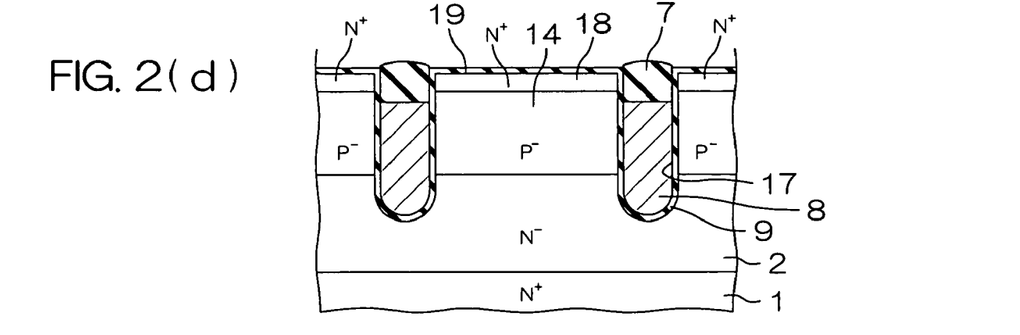

Further, N-type impurities are implanted to a thin region near the surface portion of the channel region 14 through the oxide film 19, and the silicon substrate 1 is annealed, so that an N⁺ region 18 is formed (see FIG. 2(d)).

Thereafter, by etching with the use of a mask having an opening of a predetermined pattern, a predetermined region of the oxide film 19 between the adjacent two trenches 17 is removed, so that an opening is formed. Then, through this opening in the oxide film 19, a contact hole 4 is formed which penetrates the N$^+$ region 18 and reach midway of the thickness of the channel region 14. In this state, the exposed oxide film 19 is removed by etching.

The contact hole 4 may be formed by removing the whole of the exposed oxide film 19 after forming N$^+$ region 18, then forming a resist film having an opening of a predetermined pattern and thereafter carrying out etching through the opening of the resist film. In this case, the resist layer is removed after forming the contact hole 4.

Figure 2E:
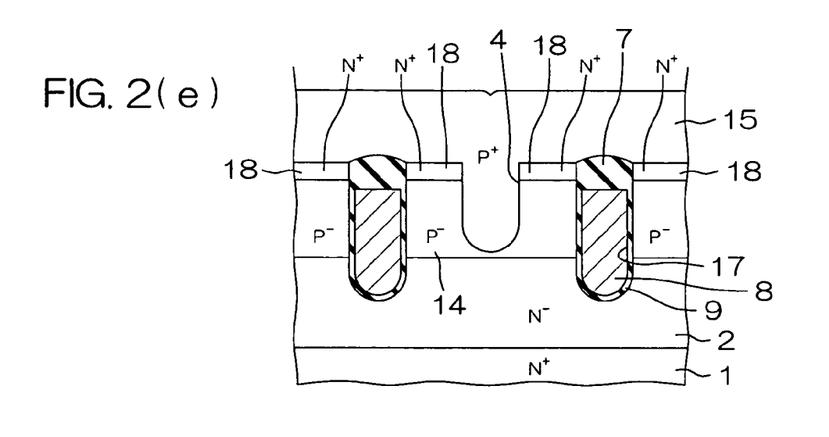

Then, by CVD (Chemical Vapor Deposition) method, a P$^+$-type CVD polysilicon film 15 doped with P-type impurities (for example, boron (B)) at a high concentration is formed so as to fill the contact hole 4. The polysilicon film 15 is also formed on the N$^+$ region 18 and the silicon oxide layer 7. This state is shown in FIG. 2(*e*).

The polysilicon film 15 may be formed by forming a polysilicon film undoped with impurities and thereafter implanting P-type impurities into the polysilicon film. Forming the polysilicon film 15 and implanting the impurities into the polysilicon film 15 can be easily carried out with the use of conventional equipments for manufacturing a semiconductor device. The concentration of the P-type impurities in the polysilicon film 15 is made lower than that of the N-type impurities in the N$^+$ region 18.

Further, after a silicon oxide film 20 is formed on the polysilicon film 15 by CVD method, the silicon substrate 1 after the abovementioned steps is heated at 900° C.~1000° C. for a predetermined time. Thereby the N-type impurities in the N$^+$ region 18 diffuse into the channel region 14, so that the N$^+$ region 18 and the channel region adjacent thereto become N$^+$-type source region 6.

Figure 2F:
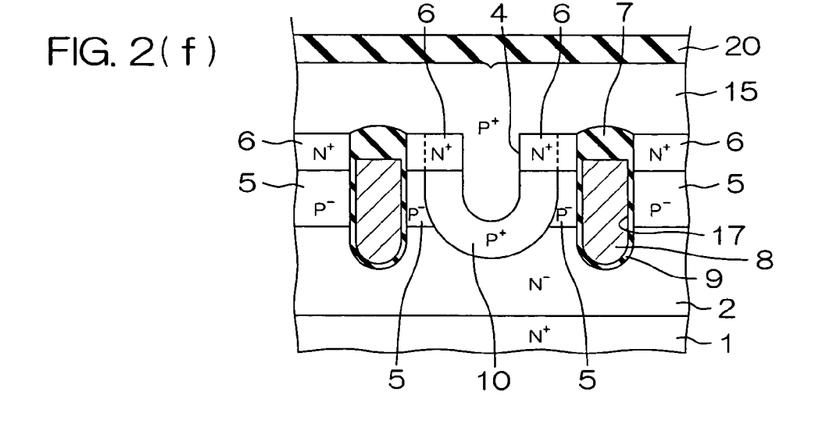

At the same time, the P-type impurities in the polysilicon film 15 diffuse into the N$^+$ region 18 (source region 6), the channel region 14 and the epitaxial layer 2. At this time, due to the difference between the impurity concentrations in the polysilicon film 15 and the N$^+$ region 18, the conductivity type of the N$^+$ region 18 (source region 6) is kept N$^+$-type. On the other hand, P-type impurities diffusing in the channel region 14 and epitaxial layer 2 form P$^+$-type low resistance region 10 extending in an isotropic manner from the polysilicon film 15 disposed in the contact hole 4. The remainder of the channel region 14 becomes the channel region 5 between the low resistance region 10 and the oxide film 9. This state is shown in FIG. 2(*f*).

Since the P-type impurities in the polysilicon film 15 are prevented from being scattered in the surrounding atmosphere by the silicon oxide film 20, they can be efficiently supplied to the channel region 14 and the epitaxial layer 2. A film may be formed of silicon nitride instead of silicon oxide film 20. In this case, the P-type impurities are efficiently supplied into the channel region 14 and the epitaxial layer 2.

As abovementioned, the polysilicon film 15 serves as a diffusion source layer for diffusing P-type impurities into the channel region and the epitaxial layer 2.

Figure 2G:
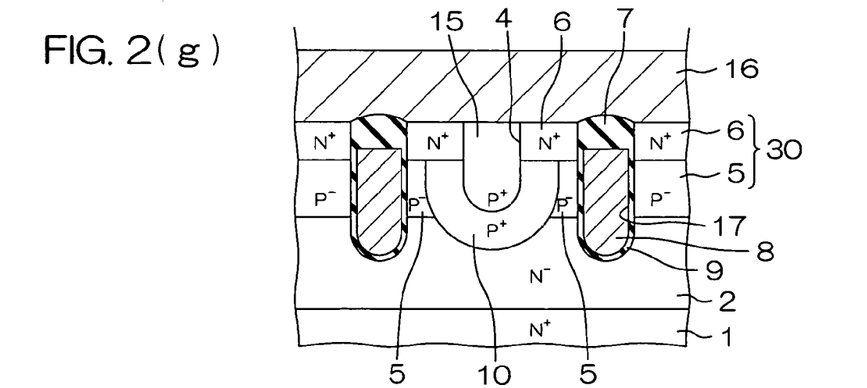

Then, the silicon oxide film 20 is removed by etching, and the polysilicon film 15 is removed with the portion thereof in the contact hole 4 being left by etching back. After the abovementioned steps, substantially on the whole surface provided with the contact hole 4 of the silicon substrate 1, aluminum atoms are deposited by sputtering method to form a aluminum thin film 16 (FIG. 2(*g*)).

Then, the silicon substrate 1 is heated. The heating temperature is 380° C.~570° C. At such a temperature, aluminum atoms constituting the aluminum thin film 16 diffuse into the polysilicon film 15 in the contact hole 4, and at the same time silicon atoms constituting the polysilicon film 15 in the contact hole 4 diffuse into the aluminum thin film 16. In other words, the aluminum thin film 16 moves into the contact hole 4 so as to replace the polysilicon film 15 and becomes a source deriving electrode 11. Thereby, the source deriving electrode 11 can be also suitably embedded even into the contact hole 4 having a large depth with respect to the width or the diameter (having a large aspect ratio), without generating voids.

Further, by heating the silicon substrate 1 in the abovementioned temperature range, aluminum atoms constituting the aluminum thin film 16 are hard to diffuse into the low resistance region 10, the source region 6, the channel region 5 and epitaxial layer 2. Therefore, it can be prevented that aluminum atoms diffuse into the epitaxial layer 2, the channel region 5 and the source region 6 to destruct P-N junction.

Heating of the silicon substrate 1 is ended after the aluminum thin film 16 comes to contact the low resistance region 10 and before the polysilicon film 15 in the contact hole 4 runs out due to diffusion of the silicon atoms constituting the polysilicon film 15. Thereby, as shown in FIG. 1, a MOS FET can be obtained in which the remainder of the polysilicon film 15 forming the diffusion source layer 12 is left at the bottom of the contact hole 4.

Figure 3A:
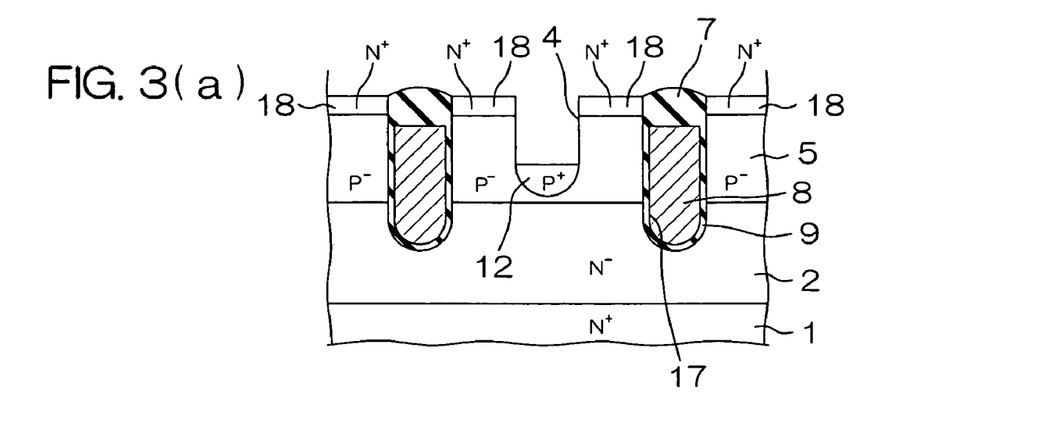
FIGS. 3(a)~3(c) are schematic sectional views for explaining another method for manufacturing the MOS FET of FIG. 1.
Figure 3B:
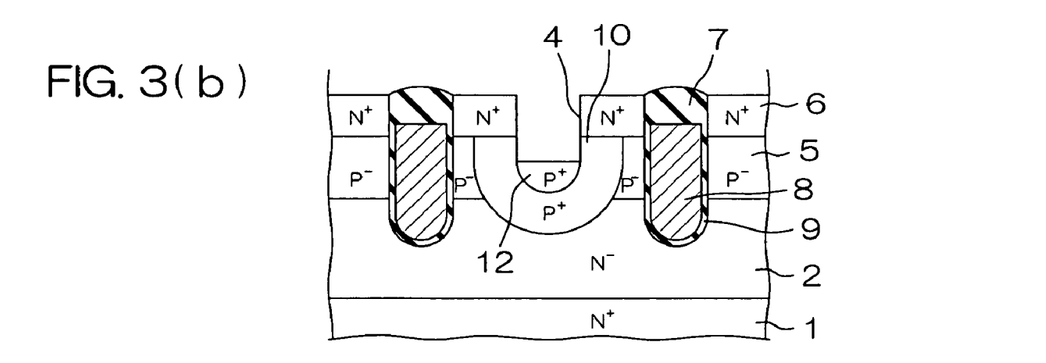
Figure 3C:
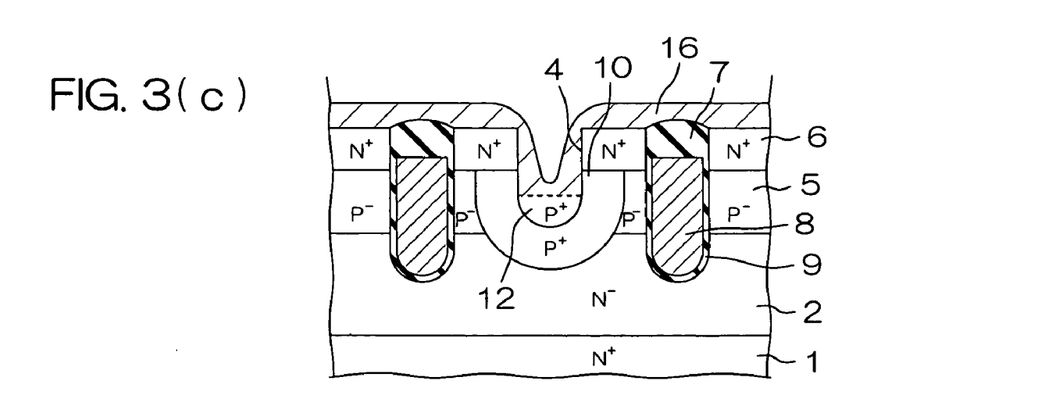

FIGS. 3(*a*), 3(*b*) and 3(*c*) are schematic sectional views illustrating another method for manufacturing a MOS FET shown in FIG. 1. In this method, after the polysilicon film 15 is formed and then it is removed with the portion thereof at the bottom of the contact hole 4 being left which steps are carried out as in the abovementioned manufacturing method, the silicon substrate 1 is heated to form a low resistance region 10.

In concrete, the steps to the step of forming polysilicon film 15 (see FIG. 2(*e*)) are carried out as in the abovementioned manufacturing method, the polysilicon film 15 is etched back to exist only at the bottom of the contact hole 4. In this state, the polysilicon film 15 and the N$^+$ region 18 are kept out of contact with each other. The remainder of the polysilicon film 15 becomes a diffusion source layer 12 (see FIG. 3(*a*)).

After these steps, the silicon substrate 1 is heated at a temperature of 900° C. ~1000° C. for a predetermined time. Thereby, P-type impurities diffuse from the diffusion source layer 12 into the channel region 14 to form a low resistance region 10 in a region extending in an isotropic manner from the diffusion source layer 12. Further, P-type impurities diffuse from N$^+$ region 18 into the channel region 14 to form a source region 6. This state is shown in FIG. 3(*b*).

At this time, since the diffusion source layer 12 and the source region 6 are not in contact with each other, the amount of impurities diffusing from the diffusion source layer 12 into the N$^+$ region 18 (source region 6) can be reduced. Thereby, the N$^+$-type source region 6 can be easily formed.

Then, substantially on the whole surface of the silicon substrate 1 provided with the low resistance region 10 in the abovementioned manner, aluminum atoms are deposited by sputtering method, so that an aluminum thin film 16 is formed. At this time, the silicon substrate 1 is heated. The heating temperature is in a range of 380° C.~570° C.

Since aluminum atoms supplied onto the silicon substrate 1 by sputtering method are hard to reach the inside of the contact hole 4, aluminum atoms are deposited mainly outside the contact hole 4 to form the aluminum thin film 16 at the beginning of the film forming step. When aluminum atoms are further supplied, the aluminum thin film 16 grows so as to come in contact with the diffusion source layer 12 in the contact hole 4. Thereby, aluminum atoms diffuse into the diffusion source layer 12, and a part of the aluminum thin film 16 formed outside the contact hole 4 moves to flow into the contact hole 4.

Further, silicon atoms constituting the diffusion source layer 12 diffuse into the aluminum thin film 16. The contact hole 4 is gradually filled with the aluminum thin film 16 in such a manner, and at the end of the film forming step, the contact hole 4 is perfectly filled with aluminum thin film 16. After stopping supplying aluminum atoms to the silicon substrate 1, the silicon substrate 1 may be continuously heated for a suitable time.

Thus, as shown in FIG. 1, an excellent source deriving electrode 11 having no void can be obtained.

Though the embodiments of the present invention have been described as above, other embodiments of the present invention can be effected. For example, in the abovementioned embodiments, the low resistance region 10 is formed so as to be in contact with the source region 6 and the epitaxial layer 2 and is disposed in a large region between the channel region 5 and the source deriving electrode 11. However, the low resistance region 10 can be so formed as not to be in contact with any or all of the source region 6, the epitaxial layer 2 and the source deriving electrode 11. In this case, the base resistance Rb (see FIG. 1) of the parasitic transistor T can be reduced and the tolerance thereof against breakage due to a back electromotive force can be increased in comparison with a case without low resistance region 10.

A MOS FET having such a structure can be realized by controlling the depth of the contact hole 4, the disposition of the diffusion source layer 12, the heating temperature and the heating time used for diffusing P-type impurities from the diffusion source layer 12 into the channel region 14 and the like.

In the abovementioned embodiment, heating of the silicon substrate 1 is ended before the polysilicon film 15 (diffusion source layer 12) runs out due to the diffusion of silicon atoms, but heating of the silicon substrate 1 may be continued till the diffusion source layer 12 runs out. In this case, a MOS FET having no diffusion source layer 12 in the contact hole 4 is obtained.

A semiconductor device according to the present invention is not limited to a device of a cell size W4 as small as 1.35 μm like a MOS FET shown in FIG. 1, but it may have a larger cell size W4 than that.

A semiconductor device according to the present invention may be a DMOS (Double Diffused MOS) or a semiconductor device other than a MOS FET, for example, an IGBT (Insulated Gate Bipolar Transistor).

Although the present invention has been described and illustrated in detail, it is clearly understood that the same is by way of illustration and example only and is not to be taken by way of limitation, the spirit and scope of the present invention being limited only by the terms of the appended claims.

This application corresponds to the Japanese Patent Application No. 2003-095384 filed in the Japan Patent Office on Mar. 31, 2003 and the whole disclosure of the Japanese application is incorporated herein by reference.

What is claimed is:

1. A semiconductor device comprising:
   a plurality of cells each including a drain region of a first conductivity type, a channel region of a second conductivity type different from the first conductivity type and a source region of the first conductivity type stacked in this order on a semiconductor substrate so as to be capable of forming a channel in a direction of a thickness of the semiconductor substrate; and
   a low resistance region of the second conductivity type having a conductivity higher than that of the channel region, the low resistance region forming a part of an inner wall of a hole formed between adjacent ones of the plurality of cells, the low resistance region extending in an isotropic manner with respect to a predetermined region in the hole so as to be in contact with the channel region,
   wherein the drain region is shared by the plurality of the cells; and
   wherein the low resistance region and the drain region are in contact with each other.

2. A semiconductor device according to claim 1, wherein the low resistance region and the source region are in contact with each other.

3. A semiconductor device according to claim 1, further comprising a source driving electrode being in contact with the source region and shared by the plurality of cells, wherein the low resistance region and the source driving electrode are in contact with each other.

4. A semiconductor device according to claim 1, wherein the hole extends downward into the drain region.

5. A semiconductor device comprising:
   a plurality of cells each including a drain region of a first conductivity type, a channel region of a second conductivity type different from the first conductivity type and a source region of the first conductivity type stacked in this order on a semiconductor substrate so as to be capable of forming a channel in a direction of a thickness of the semiconductor substrate; and
   a low resistance region of the second conductivity type having a conductivity higher than that of the channel region, the low resistance region forming a part of an inner wall of a hole formed between adjacent ones of the plurality of cells and being in contact with the channel region,
   wherein the drain region is shared by the plurality of the cells, and
   wherein the width of the cell is smaller than 2 μm.

6. A semiconductor device according to claim 5, further comprising a source driving electrode being in contact with the source region and shared by the plurality of cells, wherein the low resistance region and the source region are in contact with each other.

7. A semiconductor device according to claim 5, further comprising a source driving electrode being in contact with the source region and shared by the plurality of cells, wherein the low resistance region and the drain region are in contact with each other.

8. A semiconductor device according to claim 5 further comprising a source driving electrode being in contact with the source region and shared by the plurality of cells, wherein the low resistance region and the source driving electrode are in contact with each other.

9. A semiconductor device according to claim 5, wherein the width is the interval between two adjacent holes.

* * * * *